United States Patent
Koshi

(10) Patent No.: US 12,163,246 B2
(45) Date of Patent: **\*Dec. 10, 2024**

(54) SINGLE CRYSTAL MANUFACTURING APPARATUS AND METHOD

(71) Applicant: NOVEL CRYSTAL TECHNOLOGY, INC., Sayama (JP)

(72) Inventor: Kimiyoshi Koshi, Sayama (JP)

(73) Assignee: Novel Crystal Technology, Inc., Saitama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/214,052

(22) Filed: Jun. 26, 2023

(65) Prior Publication Data

US 2023/0332324 A1 Oct. 19, 2023

Related U.S. Application Data

(63) Continuation of application No. 17/384,977, filed on Jul. 26, 2021, now Pat. No. 11,725,299.

(30) Foreign Application Priority Data

Jul. 28, 2020 (JP) .................... 2020-127728

(51) Int. Cl.
*C30B 13/20* (2006.01)
*C30B 15/00* (2006.01)
(Continued)

(52) U.S. Cl.
CPC ............ *C30B 15/08* (2013.01); *C30B 15/002* (2013.01); *C30B 15/14* (2013.01); *C30B 29/16* (2013.01)

(58) Field of Classification Search
None
See application file for complete search history.

(56) References Cited

U.S. PATENT DOCUMENTS

| 3,249,406 A | 5/1966 | Crosby et al. |
| 3,494,742 A | 2/1970 | Kuba et al. |

(Continued)

FOREIGN PATENT DOCUMENTS

| CH | 421 911 | 10/1966 |
| EP | 3 572 559 A1 | 11/2019 |

(Continued)

OTHER PUBLICATIONS

Extended European Search Report dated Dec. 1, 2021 from related EP 21188057.0.

(Continued)

*Primary Examiner* — Robert M Kunemund
(74) *Attorney, Agent, or Firm* — Scully, Scott, Murphy & Presser, PC

(57) ABSTRACT

A single crystal manufacturing apparatus to grow a single crystal upward from a seed crystal, the apparatus including an insulated space thermally insulated from a space outside the single crystal manufacturing apparatus, an induction heating coil placed outside the insulated space, a thermal insulation plate that divides the insulated space into a first space including a crystal growth region to grow the single crystal and a second space above the first space and includes a hole above the crystal growth region, a heating element that is placed in the second space and generates heat by induction heating using the induction heating coil to heat the inside of the insulated space, and a support shaft to vertically movably support the seed crystal from below.

17 Claims, 9 Drawing Sheets

(51) Int. Cl.
*C30B 15/08* (2006.01)
*C30B 15/14* (2006.01)
*C30B 29/16* (2006.01)

(56) References Cited

U.S. PATENT DOCUMENTS

| | | | |
|---|---|---|---|
| 3,935,059 | A | 1/1976 | Ayel |
| 4,045,181 | A | 8/1977 | Burd et al. |
| 4,323,418 | A | 4/1982 | Kobayashi et al. |
| 5,069,742 | A | 12/1991 | Bleil |
| 5,258,092 | A | 11/1993 | Yamagishi et al. |
| 11,725,299 | B2 * | 8/2023 | Koshi .................... C30B 29/16 117/33 |
| 2011/0185963 | A1 | 8/2011 | Von Ammon et al. |
| 2015/0292109 | A1 | 10/2015 | Brenninger et al. |
| 2021/0222318 | A1 | 7/2021 | Shindo et al. |

FOREIGN PATENT DOCUMENTS

| | | |
|---|---|---|
| JP | H5-132390 A | 5/1993 |
| JP | 2000-247777 A | 9/2000 |
| JP | 10 2005 060 391 A | 6/2006 |
| JP | 2006-169059 A | 6/2006 |
| JP | 2006-188403 A | 7/2006 |
| JP | 2008-290885 A | 12/2008 |
| JP | 2009-051679 A | 3/2009 |
| JP | 6607651 A | 11/2019 |

OTHER PUBLICATIONS

Office Action dated Nov. 22, 2022 from parent application U.S. Appl. No. 17/384,977.
Notice of Allowance dated Mar. 28, 2023 from parent application U.S. Appl. No. 17/384,977.
Notice of Reasons for Refusal dated Feb. 27, 2024 received from the Japanese Patent Office in related Japanese Patent Application No. 2020-127728 together with English translation.
Notice of Reasons for Refusal dated Jul. 23, 2024 received from the Japanese Patent Office in related Japanese Patent Application No. 2020-127728 together with English translation.

* cited by examiner

10 INSULATED SPACE
12 THERMAL INSULATION PLATE
13 HEATING ELEMENT

SINGLE CRYSTAL MANUFACTURING APPARATUS AND METHOD

CROSS-REFERENCES TO RELATED APPLICATIONS

The present patent application is a continuation application of U.S. Ser. No. 17/384,977 filed on Jul. 26, 2021 now U.S. Pat. No. 11,725,299 and claims the priority of Japanese patent application No. 2020/127728 filed on Jul. 28, 2020, and the entire contents of both applications are hereby incorporated by reference.

TECHNICAL FIELD

The present invention relates to a single crystal manufacturing apparatus and a single crystal manufacturing method.

BACKGROUND ART

An apparatus is known which is used for manufacturing a single crystal without using a crucible (see Patent Literature 1). In the single crystal manufacturing apparatus described in Patent Literature 1, a melt of a raw material is fed into a melt formed on an upper surface of a seed crystal to obtain a mixed melt, a solid is precipitated as a single crystal from the mixed melt, and a single crystal is thereby manufactured. The melt on the upper surface of the seed crystal is formed by irradiating the upper surface of the seed crystal with infrared light from an infrared light irradiator.

According to the single crystal manufacturing apparatus not using a crucible, there is no possibility of a decrease in purity of the single crystal due to incorporation of components included in the crucible. In addition, the facility cost can be significantly reduced by using the apparatus not using the crucible since when the crucible is used, a material of the crucible is very expensive in quite a few cases depending on a type of single crystal to be manufactured.

CITATION LIST

Patent Literature

Patent Literature 1: JP 6607651 B1

SUMMARY OF INVENTION

In the single crystal manufacturing apparatus described in Patent Literature 1, however, a space around the upper surface of the growing single crystal is wide open, probably to ensure a path for the infrared light to enter. Thus, when a melting point of the material is high, an amount of heat dissipation from a crystal growth surface is large enough to adversely affect crystal growth (radiation energy is proportional to a difference between the fourth power of the object's temperature and the fourth power of the ambient temperature) and it is difficult to manufacture a large-size single crystal. In particular, it is considered to be difficult to manufacture a material having a melting point higher than that of silicon, e.g., having a melting point of not less than 1,500° C.

It is an object of the invention to provide a single crystal manufacturing apparatus that is capable of manufacturing a large-size single crystal without using any crucible, and a single crystal manufacturing method using the apparatus.

An aspect of the invention provides a single crystal manufacturing apparatus defined in [1] to [7] below and a single crystal manufacturing method defined in [8] to [12] below.

[1] A single crystal manufacturing apparatus to grow a single crystal upward from a seed crystal, the single crystal manufacturing apparatus comprising:
  an insulated space thermally insulated from a space outside the single crystal manufacturing apparatus;
  an induction heating coil placed outside the insulated space;
  a thermal insulation plate that divides the insulated space into a first space including a crystal growth region to grow the single crystal and a second space above the first space and comprises a hole above the crystal growth region;
  a heating element that is placed in the second space and generates heat by induction heating using the induction heating coil to heat the inside of the insulated space; and
  a support shaft to vertically movably support the seed crystal from below.

[2] The apparatus defined in [1], wherein a thermal insulation material is placed in the first space so as to surround the crystal growth region.

[3] The apparatus defined in [1] or [2], wherein a second heating element which generates heat by induction heating using the induction heating coil is placed in the first space.

[4] The apparatus defined in any one of [1] to [3], wherein the thermal insulation plate has a thickness distribution so that a temperature of an outer peripheral portion of an upper surface of the single crystal is higher than a temperature of a region on the inner side thereof.

[5] The apparatus defined in any one of [1] to [4], wherein a feeding port for a raw material of the single crystal is provided above the insulated space so as to be located directly above the center of the support shaft.

[6] The apparatus defined in any one of [1] to [5], further comprising an annular member that is placed inside the hole of the thermal insulation plate and is capable of controlling a cross-sectional shape of the single crystal by a shape of an opening region.

[7] The apparatus defined in any one of [1] to [6], further comprising a funnel to drop a melt of a raw material of the single crystal onto the upper surface of the single crystal.

[8] A single crystal manufacturing method, comprising:
  placing a seed crystal in a first space of an insulated space divided into the first space and a second space above the first space by a thermal insulation plate comprising a hole so that the seed crystal is located below the hole;
  inductively heating a heating element placed in the second space and melting an upper surface of the seed crystal by heat radiated from the heating element;
  feeding a melt of a raw material of a single crystal onto the molten upper surface of the seed crystal through the second space and the hole of the thermal insulation plate; and
  moving the seed crystal downward while continuously feeding the melt of the raw material and growing the single crystal upward from the seed crystal.

[9] The method defined in [8], wherein in the feeding the melt of the raw material of the single crystal, the melt of the raw material obtained by melting a lower end of a raw material rod with heat in the second space is dropped.

[10] The method defined in [8], wherein in the feeding the melt of the raw material of the single crystal, the melt of the raw material, which is obtained by melting a lower end of a hollow raw material rod with heat in the second space and also melting a powder or granule raw material poured down into the hollow raw material rod with heat in the second space at the lower end of the hollow raw material rod, is dropped.

[11] The method defined in [8], wherein in the feeding the melt of the raw material of the single crystal, the melt of the raw material obtained by melting a powder or granule raw material poured down into a funnel with heat in the second space is dropped.

[12] The method defined in [10] or [11], wherein in the feeding the melt of the raw material of the single crystal, the powder or granule raw material is formed by reacting a metal with an oxygen gas.

Advantageous Effects of Invention

According to an embodiment of the invention, it is possible to provide a single crystal manufacturing apparatus capable of manufacturing a large-size single crystal without using any crucible, and a single crystal manufacturing method using the apparatus.

DESCRIPTION OF EMBODIMENTS

Embodiment (Configuration of a Manufacturing Apparatus)

Figure 1:
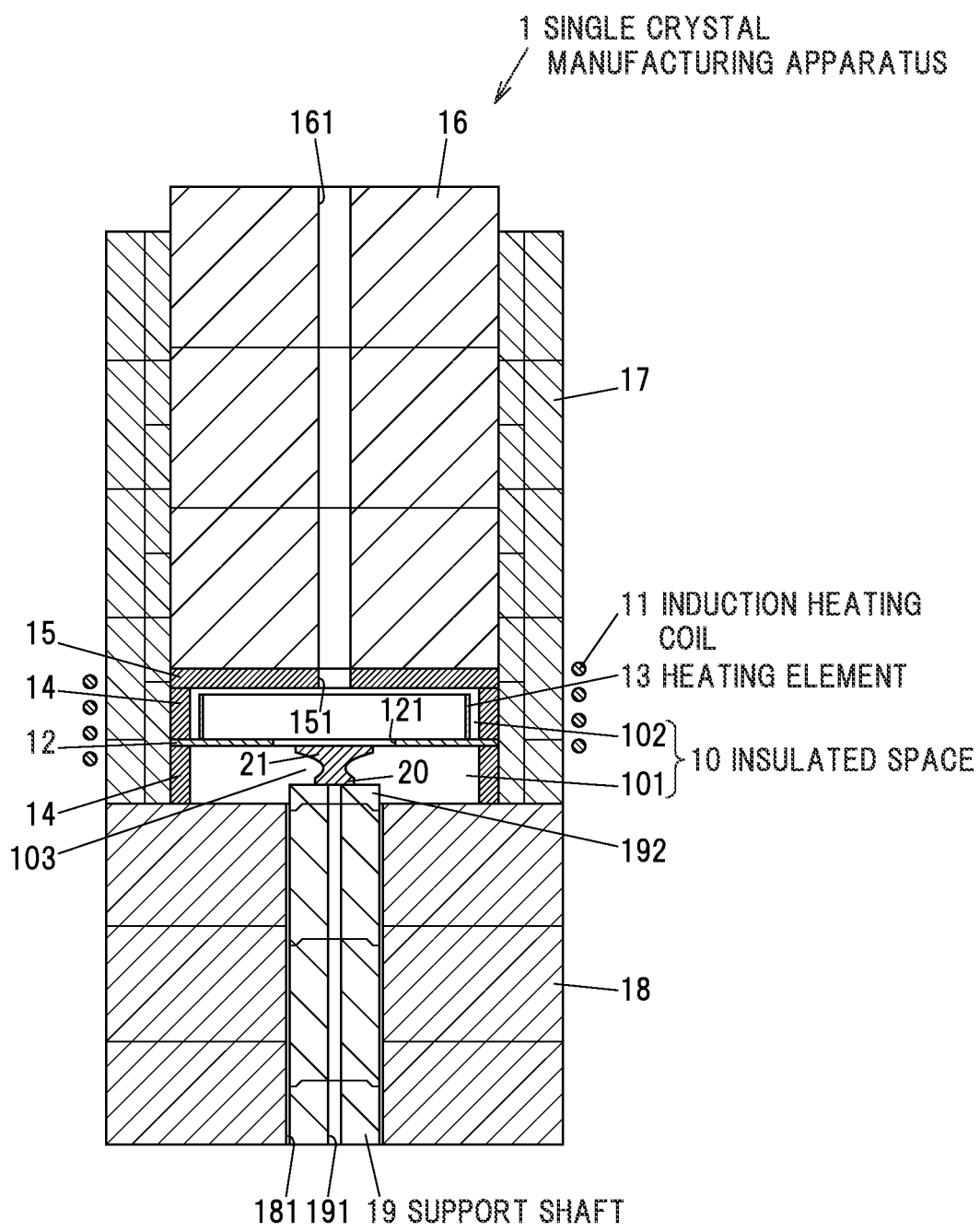
FIG. 1 is a vertical cross-sectional view showing a single crystal manufacturing apparatus in an embodiment of the present invention.
Figure 2:
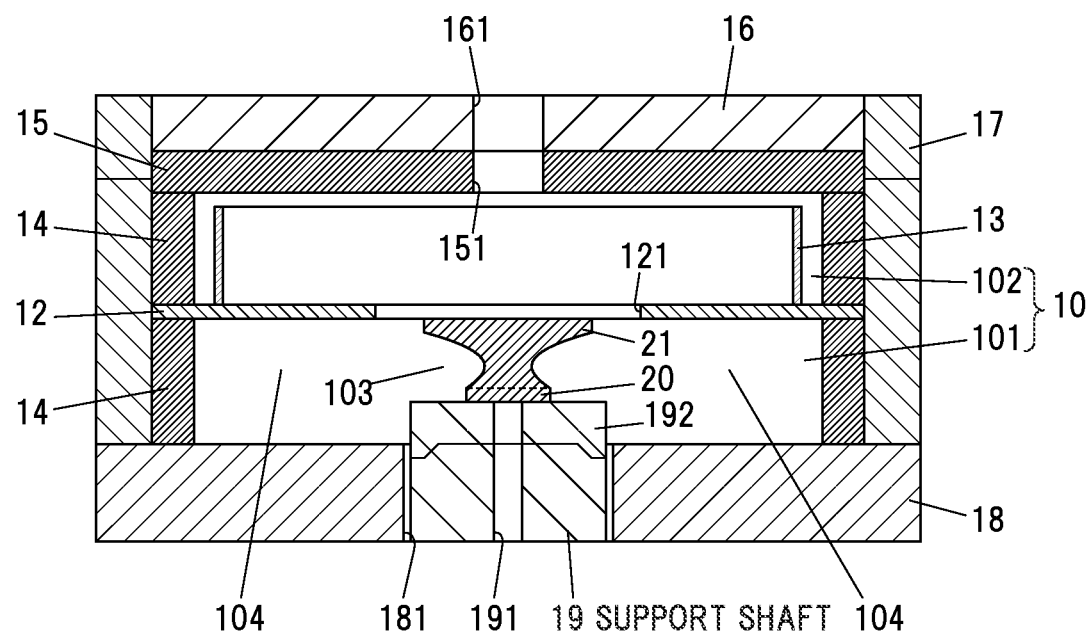
FIG. 2 is an enlarged vertical cross-sectional view showing a portion around an insulated space of the single crystal manufacturing apparatus.

FIG. 1 is a vertical cross-sectional view showing a single crystal manufacturing apparatus 1 in an embodiment of the invention. FIG. 2 is an enlarged vertical cross-sectional view showing a portion around an insulated space 10 of the single crystal manufacturing apparatus 1. The single crystal manufacturing apparatus 1 is an apparatus to grow a single crystal 21 upward from a seed crystal 20 by feeding a raw material onto an upper surface of the seed crystal 20 without using a crucible.

The single crystal manufacturing apparatus 1 includes the insulated space 10 thermally insulated from a space outside the apparatus, an induction heating coil 11 placed outside the insulated space 10, a thermal insulation plate 12 that divides the insulated space 10 into a first space 101 and a second space 102 above the first space 101, a heating element 13 that is placed in the second space 102, generates heat by an induced current flowing therethrough due to electromagnetic induction using the induction heating coil 11 and heats the inside of the insulated space 10, and a support shaft 19 to vertically movably support the seed crystal 20 from below. The vertical direction in the present embodiment is a direction along or substantially along an upright direction.

The first space 101 of the insulated space 10 includes a crystal growth region 103 that is a region to grow the single crystal 21. The crystal growth region 103 is included in a region directly above a hole 181 of a base 18 (described later). The thermal insulation plate 12 has a hole 121 located above the crystal growth region 103. It is thus possible to feed a raw material of the single crystal 21 through the second space 102 and the hole 121 of the thermal insulation plate 12 onto the upper surface of the seed crystal 20 or an upper surface of the single crystal 21 grown on the seed crystal 20.

The single crystal manufacturing apparatus 1 also includes a thermal insulation material 14 serving as a side wall of the insulated space 10, a thermal insulation material 15 serving as an upper wall of the insulated space 10, a thermal insulation material 16 placed on the thermal insulation material 15, an outer wall 17 surrounding the thermal insulation materials 14, 15, 16, and the base 18 serving as a bottom support for the thermal insulation materials 14, 15, 16 and the outer wall 17. These members are formed of a heat resistant material that can withstand temperatures near a melting point of the single crystal 21.

When the single crystal 21 is, e.g., a gallium oxide-based single crystal, the thermal insulation material 14 is formed of, e.g., porous zirconia or a zirconia fiber board. The thermal insulation material 15 is formed of, e.g., porous zirconia or a zirconia fiber board. The thermal insulation material 16 is formed of, e.g., an alumina fiber board. The outer wall 17 is formed of, e.g., an alumina fiber board. The base 18 is formed of, e.g., an alumina board.

The thermal insulation material 15 is most easily deformed because of its shape or arrangement position. Therefore, it is preferable that a hardening-treated zirconia fiber board, hardening-treated porous alumina, hardening-treated dense zirconia, hardening-treated dense alumina or a zirconia fiber board coated with zirconia cement be used as the thermal insulation material 15. Pre-use high-temperature annealing, e.g., high-temperature annealing at 1,700-1,900° C. is used for hardening treatment of the zirconia fiber board, etc., mentioned above. In this regard, the present inventors are the first to discover that such high-temperature pre-annealing hardens the zirconia fiber board, etc., and suppresses deformation in a high-temperature environment.

The thermal insulation material 15 can be used as a thermal insulation material around the heating element where the temperature is the highest, also in various high-temperature heating apparatuses such as crystal growth furnace, firing furnace or annealing furnace, in addition to the single crystal manufacturing apparatus 1. Since deformation or cracks due to deformation can be prevented in each case, it is possible to stabilize the temperature inside the furnace. In addition, since the thermal insulation material 15 has a long life, it is possible to reduce the maintenance cost, etc. for the apparatus.

Meanwhile, it is preferable that an alumina fiber board with an alumina blanket attached to the inner surface be used as the outer wall 17. In this case, cracks of the outer wall 17 when the thermal insulation material 16 expands can be suppressed by using cushioning properties of the alumina blanket. The alumina blanket attached to the inner surface of the alumina fiber board is required to have a thickness capable of cushioning the expansion of the thermal insulation material 16 that is placed on the alumina blanket side. However, since it is difficult to measure the amount of expansion of the thermal insulation material in a high-temperature environment, it is preferable to use an alumina blanket with a thickness that is presumably enough effective, e.g., a thickness of not less than 5 mm, preferably not less than 10 mm. In addition, considering the ease of handling, the alumina fiber board to which the alumina blanket is attached preferably has a thickness of not less than 10 mm The outer wall 17 can be used also in various high-temperature heating apparatuses such as crystal growth furnace, firing furnace or annealing furnace, in addition to the single crystal manufacturing apparatus 1. In this regard, the present inventors are the first to discover such a method in which an alumina blanket is attached to the inner surface of the alumina fiber board to absorb expansion of the adjacent members.

The zirconia fiber board described above is a fibrous thermal insulation material obtained by vacuum-forming of zirconia fiber. The alumina fiber board is a fibrous thermal insulation material obtained by molding alumina fiber to which inorganic and organic binders are added. The alumina blanket is a fibrous thermal insulation material obtained by processing needle-punched alumina fibers into a mat shape.

The induction heating coil 11 is placed at a position surrounding the heating element 13 from the outside of the outer wall 17. When a magnetic field generated around the induction heating coil 11 by passing a current through the induction heating coil 11 passes inside the annular heating element 13, induced current flows through the heating element 13, and the heating element 13 generates heat due to electrical resistance of the heating element 13.

The heating element 13 is formed of a heat resistant conductor that can withstand temperatures near the melting point of the single crystal 21. When the single crystal 21 is, e.g., a gallium oxide-based single crystal, iridium or platinum rhodium or zirconia-coated iridium or platinum rhodium is used as the heating element 13. The heating element 13 has an annular shape and is typically in a cylindrical shape as shown in FIG. 1. The heating element 13 is placed on the thermal insulation plate 12 so as to surround a space directly above the crystal growth region 103.

The thermal insulation plate 12 is formed of a heat resistant material that can withstand temperatures near the melting point of the single crystal 21, and is formed of, e.g., a porous zirconia. In addition, to suppress deformation, the material used for the thermal insulation material 15 described above, such as hardening-treated zirconia fiber board, is preferably used as the material of the thermal insulation plate 12. The thermal insulation plate 12 is used to selectively melt the upper surface of the seed crystal 20 to be a growth surface of the single crystal 21 or the upper surface of the single crystal 21.

Radiation emitted from the heating element 13 directly reaches the crystal growth region 103 of the first space 101 by passing through the hole 121 of the thermal insulation plate 12. On the other hand, the radiation emitted from the heating element 13 reaches a region 104 around the crystal growth region 103 in the first space 101 after being weakened by the thermal insulation plate 12. Thus, the seed crystal 20 and the single crystal 21 in the crystal growth region 103 are heated more strongly from above than from the side. It is thereby possible to selectively melt the upper surface of the seed crystal 20 to be a growth surface of the single crystal 21 or the upper surface of the single crystal 21.

To ensure the symmetry of temperature distribution in the first space 101, the thermal insulation plate 12 is preferably placed so that the surface thereof is horizontal as shown in FIG. 1. In addition, to suppress a decrease in temperature of an outer peripheral portion of the crystal growth surface, the contour of the hole 121 is preferably located outside the contour of the single crystal 21 so that the thermal insulation plate 12 does not cover the outer peripheral portion of the crystal growth surface. A diameter of the hole 121 is set to, e.g., a value obtained by adding 10 mm to a diameter of the single crystal 21.

The support shaft 19 can be vertically moved in the shaft hole 181 vertically penetrating the base 18 by a drive mechanism (not shown). The support shaft 19 can be vertically moved in the crystal growth region 103 of the first space 101 and the shaft hole 181 thereunder. Optionally, the support shaft 19 can be rotated around its central axis by the drive mechanism mentioned above. In this case, it is possible to rotate the seed crystal 20 supported by the support shaft 19 and the single crystal 21 grown from the seed crystal 20.

In addition, the support shaft 19 may have a hole 191 vertically penetrating the support shaft 19. Temperatures of the seed crystal 20 and the single crystal 21 can be measured by a thermocouple or a radiation thermometer via the hole 191. The support shaft 19 is formed of a heat resistant material that can withstand temperatures near the melting point of the single crystal 21, and when the single crystal 21 is, e.g., a gallium oxide-based single crystal, the support shaft 19 is formed of a zirconia fiber board, an alumina fiber board, porous zirconia, porous alumina, or a combination thereof. In addition, a portion 192 of the support shaft 19 which is in contact with the single crystal 21 is formed of a heat resistant material that can withstand temperatures near the melting point of the single crystal 21 and does not react with the material of the single crystal 21, and the portion 192 is formed of, e.g., porous alumina, dense alumina, sapphire or iridium. The support shaft 19 is composed of, e.g., plural blocks that are coupled vertically, as shown in FIG. 1.

The thermal insulation material 15 serving as the upper wall of the insulated space 10 has a through-hole 151 vertically penetrating the thermal insulation material 15. The thermal insulation material 16 on the thermal insulation material 15 has a through-hole 161 vertically penetrating the thermal insulation material 16. The through-hole 151 and the through-hole 161 are continuous and connect the insulated space 10 to the space outside the single crystal manufacturing apparatus 1. Thus, it is possible to feed a raw material of the single crystal 21 into the insulated space 10 via the through-holes 151, 161. The through-holes 151, 161 have a diameter of, e.g., 5 to 30 mm (Single Crystal Manufacturing Method)

Next, an example of a method for manufacturing the single crystal 21 using the single crystal manufacturing apparatus 1 will be described.

Firstly, the seed crystal 20 is placed on the support shaft 19 below the hole 121, and the vertical position of the support shaft 19 is then adjusted so that the seed crystal 20 is placed in the first space 101 of the insulated space 10. At this time, to efficiently heat the upper surface of the seed crystal 20, the seed crystal 20 is preferably placed as high as possible in the first space 101, e.g., at a position where the height of the upper surface of the seed crystal 20 coincides with the height of the lower surface of the thermal insulation plate 12.

Next, the heating element 13 placed in the second space 102 is heated inductively by passing a current through the induction heating coil 11, and the upper surface of the seed crystal 20 is melted by heat radiated from the heating element 13. At this time, it is possible to selectively melt the upper surface of the seed crystal 20 by the thermal insulation plate 12 as described above.

Next, a melt of a raw material of the single crystal 21 is fed onto the molten upper surface of the seed crystal 20 through the second space 102 and the hole 121 of the thermal insulation plate 12. The method of feeding the melt of the raw material of the single crystal 21 will be described later.

Figure 3A:
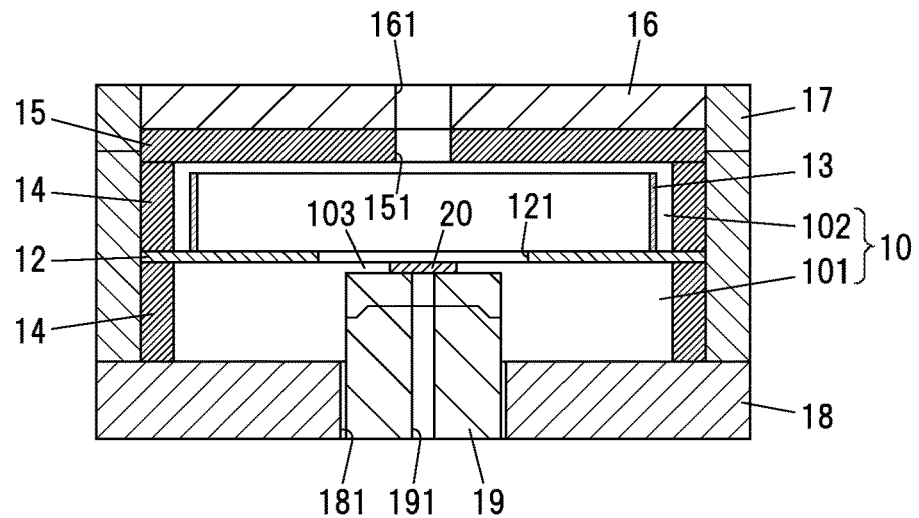
FIGS. 3A to 3C are vertical cross-sectional views showing a growth process of a single crystal.
Figure 3B:
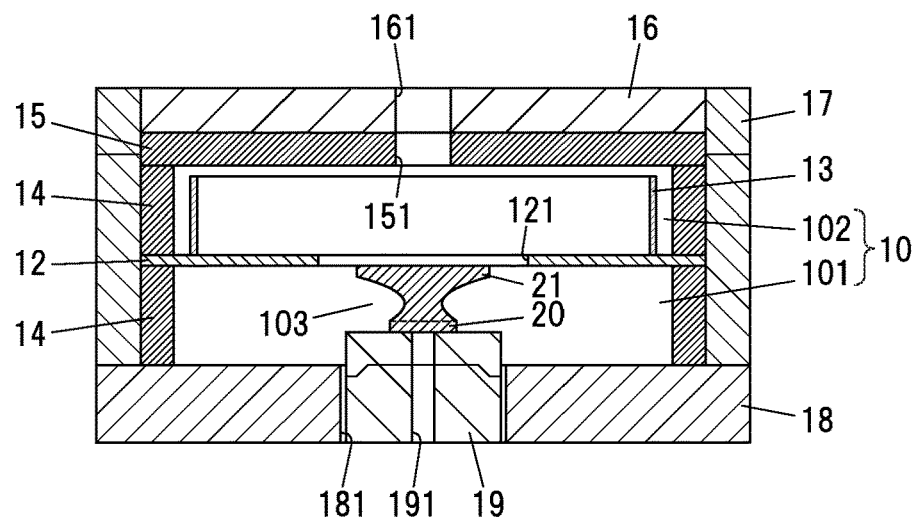
Figure 3C:
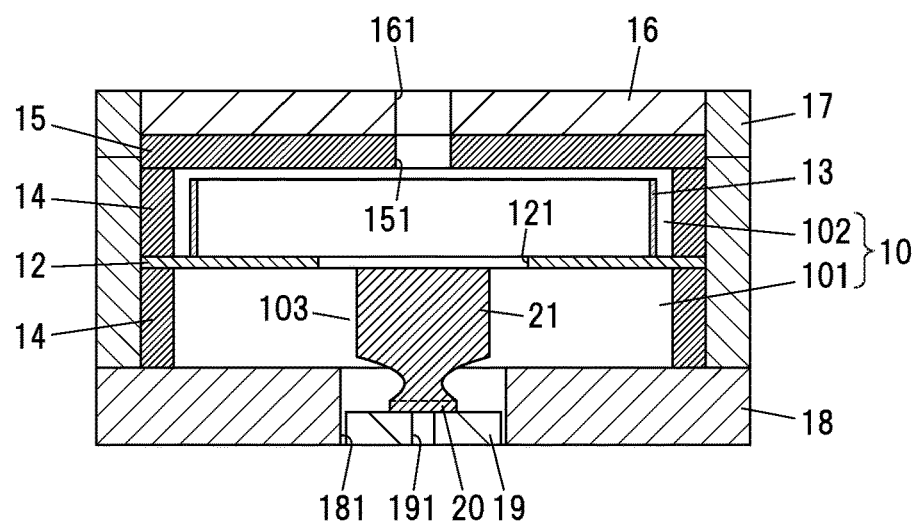

Next, as shown in FIGS. 3A to 3C, the seed crystal 20 is moved downward by moving down the support shaft 19 while continuously feeding the melt of the raw material of the single crystal 21, and the melt is gradually crystallized from below. As a result, the single crystal 21 grows upward from the seed crystal 20. A growth rate of the single crystal 21 is set to, e.g., 2 to 8 mm/h. When growing the single crystal 21 while rotating it, a rotational speed is set to, e.g., 3 to 12 rpm.

In the example shown in FIGS. 3A to 3C, during the growth process of the single crystal 21, necking is performed and the diameter of the single crystal 21 is then enlarged by shouldering (diameter increase). By performing the necking, quality of the single crystal 21 can be improved when quality of the seed crystal 20 is not high. By performing the shouldering, the diameter of the single crystal 21 which is reduced at a neck portion can be increased.

However, when the seed crystal 20 has good enough quality, it is not necessary to perform the necking. The neck portion when having a small diameter cannot support the weight of the grown single crystal 21 and the crystal may be broken at the neck portion. To prevent breaking at the neck portion, a mechanism to support the crystal at the shoulder portion may be provided in the single crystal manufacturing apparatus 1 but this makes the structure of the single crystal manufacturing apparatus 1 complicated. Such a problem can be avoided when the necking is not performed.

Meanwhile, when the necking is not performed and the seed crystal 20 having substantially the same diameter (e.g., a difference of ±10%) as the diameter of the desired single crystal 21 is used, the shouldering also may not be performed. In this case, a problem caused by the shouldering, such as crystal twinning, can be avoided and a higher-quality single crystal 21 can be obtained.

Figure 4A:
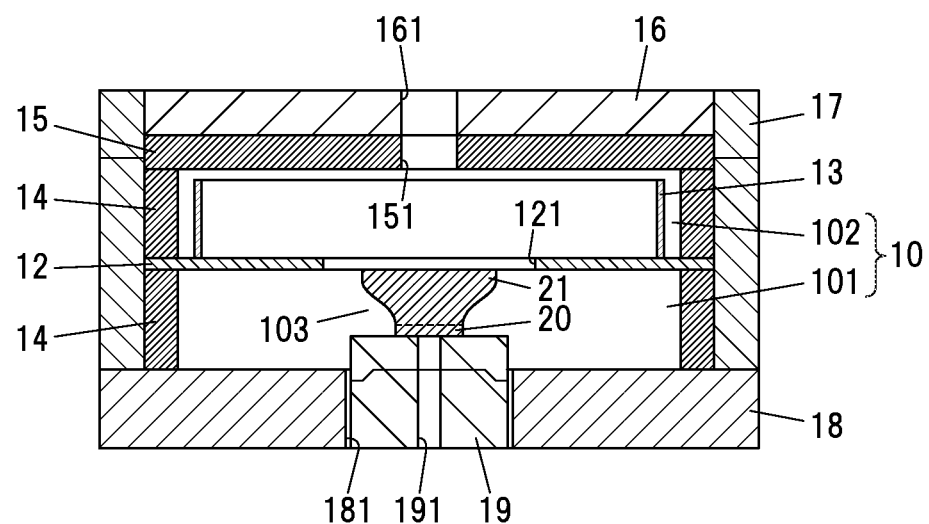
FIG. 4A is a vertical cross-sectional view showing a shape of the single crystal during the growth process when only shouldering is performed without performing necking.
Figure 4B:
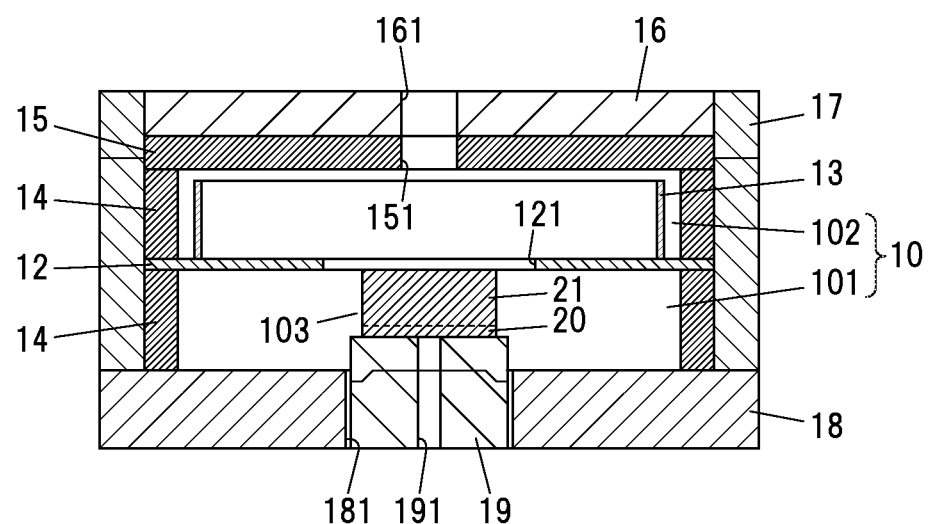
FIG. 4B is a vertical cross-sectional view showing the shape of the single crystal during the growth process when neither the necking nor the shouldering is performed.

FIG. 4A shows a shape of the single crystal 21 during the growth process when only the shouldering is performed without performing the necking, and FIG. 4B shows the shape of the single crystal 21 during the growth process when neither the necking nor the shouldering is performed.

In the single crystal manufacturing apparatus 1, the upper surface of the seed crystal 20 as the growth surface or the upper surface of the single crystal 21 is located right under the high-temperature second space 102 in which the heating element 13 is placed. Thus, heat dissipation from the crystal growth surface is suppressed and it is possible to manufacture the large-size single crystal 21.

An atmosphere during the growth of the single crystal 21 can be selected according to the material of the heating element 13, and when the heating element 13 is formed of, e.g., a non-oxidizable material, it is possible to use an oxygen atmosphere. When the single crystal 21 is a gallium oxide-based single crystal, iridium is normally used as the material of the heating element 13. In this case, to suppress oxidation of iridium, an oxygen concentration in the atmosphere is preferably less than 10% (e.g., 4%). When the surface of the iridium is coated with zirconia, the oxygen concentration in the atmosphere is preferably less than 50%.

(Method of Controlling Temperature Distribution)

Next, a method of controlling temperature distribution on the growth surface of the single crystal 21 (the upper surface of the seed crystal 20 or the upper surface of the single crystal 21) will be described. The temperature distribution on the growth surface of the single crystal 21 is preferably a distribution in which temperatures of the center portion and the outer peripheral portion are substantially equal (flat distribution), or a distribution in which temperature is low at the center portion and high at the outer peripheral portion (convex downward distribution). As a result, an interface between the single crystal 21 and the melt thereon (a solid-liquid interface) can be made flat or convex upward and it is possible to suppress occurrence of crystal defects due to concentration of strain at the center of the crystal.

Figure 5A:
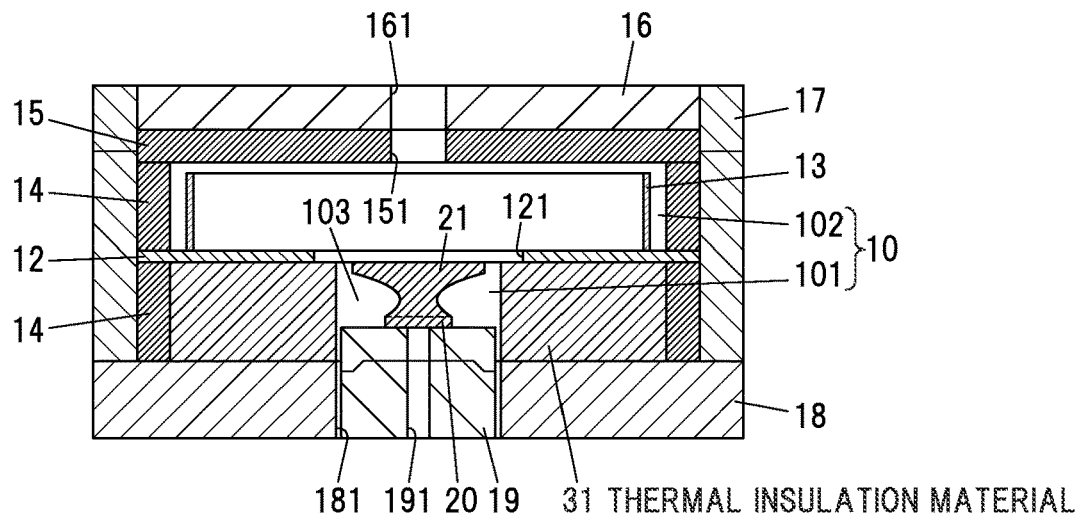
FIGS. 5A and 5B are vertical cross-sectional views each showing a structure in which an annular thermal insulation material surrounding a crystal growth region is placed in a region around the crystal growth region in a first space.
Figure 5B:
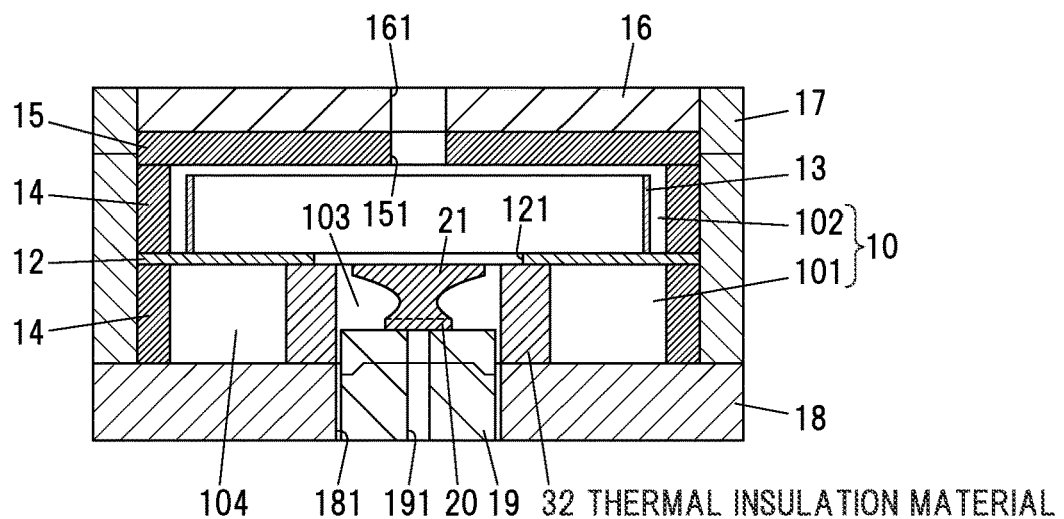

FIGS. 5A and 5B are vertical cross-sectional views each showing a structure in which an annular thermal insulation material 31 or 32 surrounding the crystal growth region 103 is placed in the region 104 around the crystal growth region 103 in the first space 101.

The thermal insulation material 31 shown in FIG. 5A is a thermal insulation material provided in the whole region 104, and the thermal insulation material 32 shown in FIG. 5B is a thermal insulation material provided in a part of the region 104 in the vicinity of the crystal growth region 103. The thermal insulation materials 31, 32 are formed of a heat resistant material that can withstand temperatures near the melting point of the single crystal 21, and are formed of, e.g., porous zirconia.

By using the thermal insulation materials 31, 32 surrounding the crystal growth region 103, it is possible to suppress heat dissipation from the side surface of the single crystal 21 and increase the temperature of the outer peripheral portion of the crystal growth surface. The temperature distribution on the growth surface of the single crystal 21 is thereby easily made flat or convex downward.

In addition, by using the thermal insulation materials 31, 32, it is also possible to reduce dispersion of the temperature distribution in the growth direction of the single crystal 21 (the vertical direction) and improve quality of the single crystal 21. These effects can be obtained in the same manner when using the thermal insulation material 31 and when using the thermal insulation material 32.

Figure 5C:
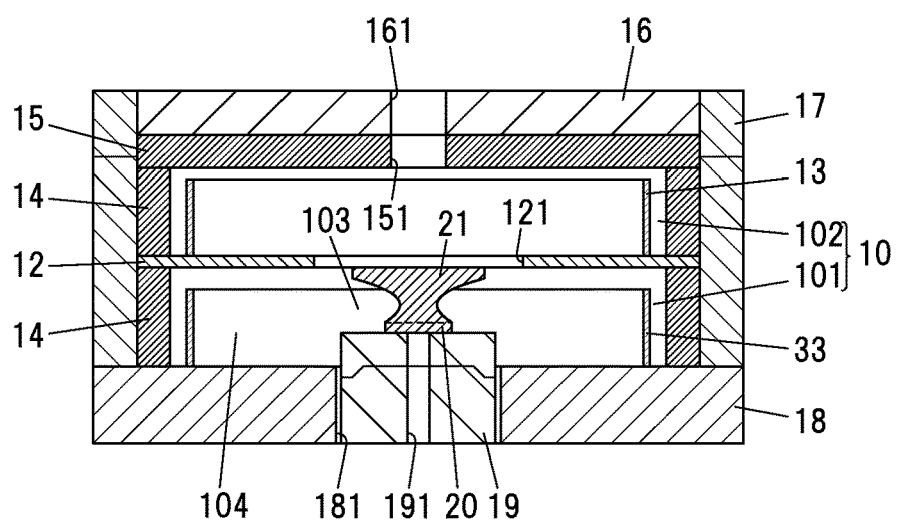
FIG. 5C is a vertical cross-sectional view showing a structure in which a heating element is placed in the region around the crystal growth region in the first space.

FIG. 5C is a vertical cross-sectional view showing a structure in which a heating element 33, which is the same member as the heating element 13, is placed in the region 104 around the crystal growth region 103 in the first space 101. The heating element 33 is heated inductively by passing a current through the induction heating coil 11 and thereby generates heat, in the same manner as the heating element 13.

The heating element 33 heats the single crystal 21 from the side and thus can increase the temperature of the outer peripheral portion of the growth surface of the single crystal 21. The temperature distribution on the growth surface of the single crystal 21 is thereby easily made flat or convex downward.

In this regard, however, the heating by the heating element 33 needs to be weaker than the heating by the heating element 13 to suppress melting of a portion of the single crystal 21 other than the upper surface. For this purpose, it is possible to take measures such as, e.g., using the heating element 33 in combination with the thermal insulation material 32 shown in FIG. 5B so that radiation emitted from the heating element 33 is weakened by the thermal insulation material 32, or reducing the heat generation amount of the heating element 33 by providing the induction heating coil 11 only on a side of the heating element 13.

Figure 6A:
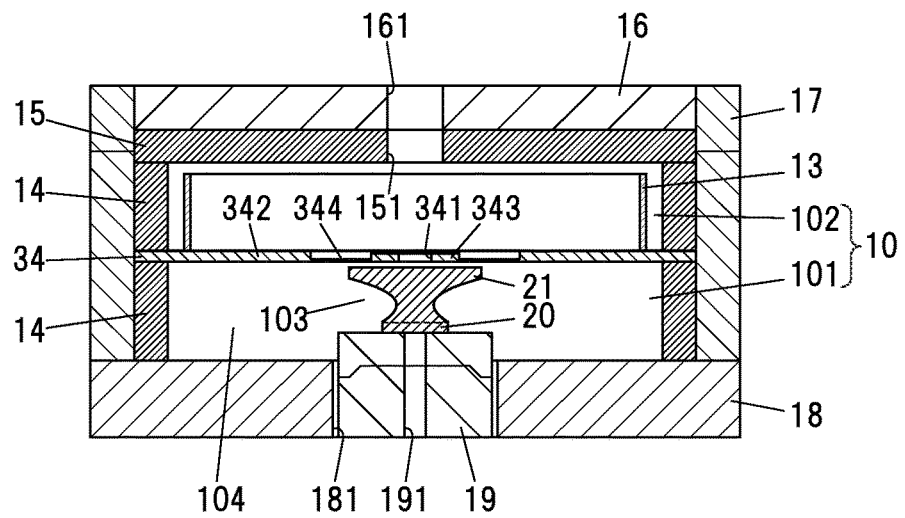
FIGS. 6A and 6B are vertical cross-sectional views each showing a structure in which a thermal insulation plate having a thickness distribution is placed.
Figure 6B:
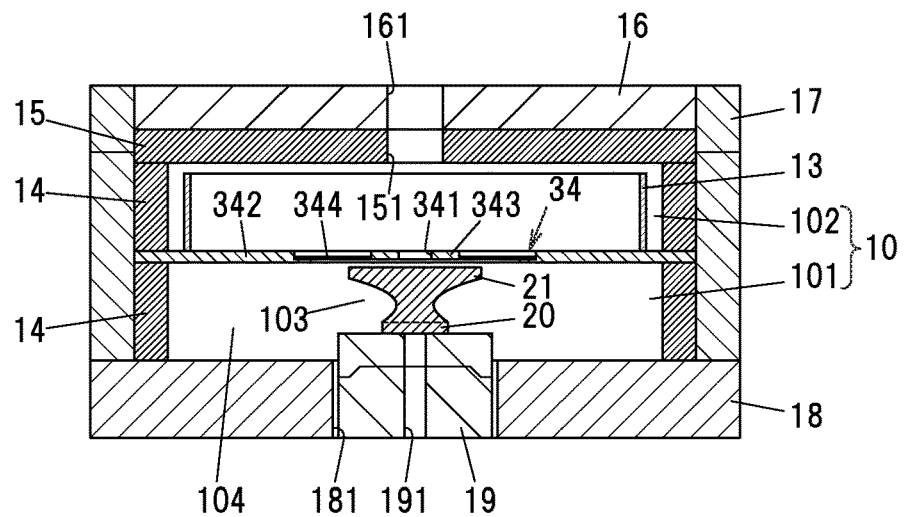

FIGS. 6A and 6B are vertical cross-sectional views each showing a structure in which a thermal insulation plate 34 having a thickness distribution is placed instead of the thermal insulation plate 12. In the thermal insulation plate 34, a thickness of a portion 342 located above the region 104 around the crystal growth region 103 is the largest, a thickness of a portion 344 located above the outer peripheral portion of the growth surface of the single crystal 21 is the smallest, and a thickness of a portion 343 on the inner side of the portion 344 is smaller than the thickness of the portion 342 and larger than the thickness of the portion 344.

Since the portion of the thermal insulation plate 34 with a larger thickness more greatly weakens the radiation emitted from the heating element 33, the temperature of the outer peripheral portion of the growth surface of the single crystal 21 can be increased to higher than the temperature of the region on the inner side thereof, and the temperature of the side surface of the single crystal 21 can be reduced to lower than the temperature of the growth surface. The temperature distribution on the growth surface of the single crystal 21 is thereby easily made flat or convex downward.

Although the thermal insulation plate 34 shown in FIG. 6A is formed such that the portions 342-344 are integrally provided and the thermal insulation plate 34 shown in FIG. 6B is formed such that a member including the portion 342 is provided separately from a member including the portions 343, 344, the same effects can be obtained with either form.

The thermal insulation plate 34 has a hole 341 needed to feed the melt of the raw material to the single crystal 21. To suppress a temperature rise at the central portion of the crystal growth surface, a diameter of the hole 341 is preferably as small as possible in a range that does not cause a problem in feeding the melt of the raw material.

Meanwhile, when a transparent member which can be used at high temperature, such as sapphire, is used as the material of the thermal insulation plate 34, the same effect can be obtained by forming surface roughness distribution to give a distribution to an amount of transmittance of radiation emitted from the heating element 13, instead of forming the thickness distribution. In particular, for example, the surface of the portion 344 is smooth, the surface roughness of the portion 342 is the largest, and the surface roughness of the portion 343 is smaller than the surface roughness of the portion 342.

Figure 6C:
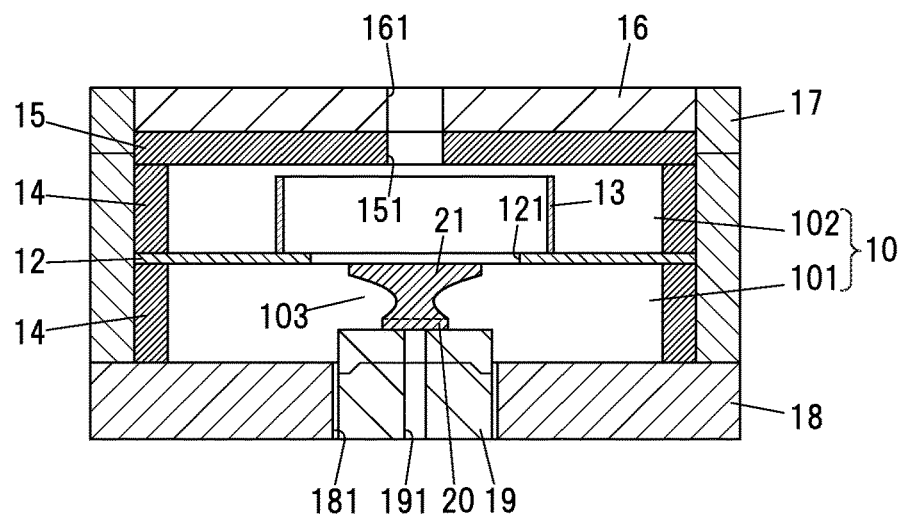
FIG. 6C is a vertical cross-sectional view showing a structure in which a diameter of the annular heating element is smaller.

FIG. 6C is a vertical cross-sectional view showing a structure in which a diameter of the annular heating element 13 is smaller than that shown in FIG. 2, etc. Since a ratio of a distance between the heating element 13 and the outer peripheral portion of the crystal growth surface with respect to a distance between the heating element 13 and the central portion of the crystal growth surface becomes large by reducing the diameter of the heating element 13, it is possible to relatively increase the temperature of the outer peripheral portion of the crystal growth surface. Thus, the temperature distribution is convex upward when the diameter of the heating element 13 is large, but it can be made flat or convex downward by reducing the diameter of the heating element 13.

In addition, it is possible to lower the temperature of the central portion of the growth surface by providing the raw material feeding through-holes 151, 161 directly above the center of the growth surface of the single crystal 21, i.e., directly above the center of the support shaft 19. The temperature distribution on the growth surface of the single crystal 21 is thereby easily made flat or convex downward. In addition, to effectively lower the temperature of the central portion of the growth surface, the diameters of the through-holes 151, 161 are preferably large to some extent (e.g., 10-60% of the diameter of the single crystal 21).

In addition, separately from the raw material feeding through-holes 151, 161, a hole to lower the temperature of the central portion of the growth surface of the single crystal 21 may be provided directly above the center of the growth surface. In this case, the melt of the raw material is dropped to a position off the center of the growth surface of the single crystal 21 since the raw material feeding through-holes 151, 161 are provided at a position off the center of the growth surface of the single crystal 21, but there is no problem as long as the single crystal 21 is grown while rotating it. In addition, in this case, there is an advantage in that a distribution of impurities in the single crystal 21 is more gradual than when dropping the melt on the center of the growth surface of the single crystal 21.

(Method of Controlling a Cross-Sectional Shape of the Single Crystal)

Next, a method of controlling a cross-sectional shape of the single crystal 21 will be described. The cross-sectional shape here means a shape of a radial cross section. For example, the cross-sectional shape of the columnar single crystal 21 is a circular shape and the cross-sectional shape of the polygonal prism-shaped single crystal 21 is a polygonal shape.

The cross-sectional shape of the single crystal 21 depends on the shape of the hole 121 of the thermal insulation plate 12. This is because the temperature distribution on the upper surface of the single crystal 21 depends on the shape of the hole 121, and melting of the upper surface of the single crystal 21 and crystal growth occur in a region having a similar shape to the hole 121. For example, the cross-sectional shape of the single crystal 21 is a circular shape when the hole 121 has a circular shape, and the cross-sectional shape of the single crystal 21 is a polygonal shape with rounded corners when the hole 121 has a polygonal shape.

However, when the thermal insulation plate 12 having the polygonal hole 121 is used to grow the single crystal 21 having a polygonal cross-sectional shape while rotating the single crystal 21 about its rotational axis, it is necessary to also rotate the thermal insulation plate 12 according to rotation of the single crystal 21.

Figure 7A:
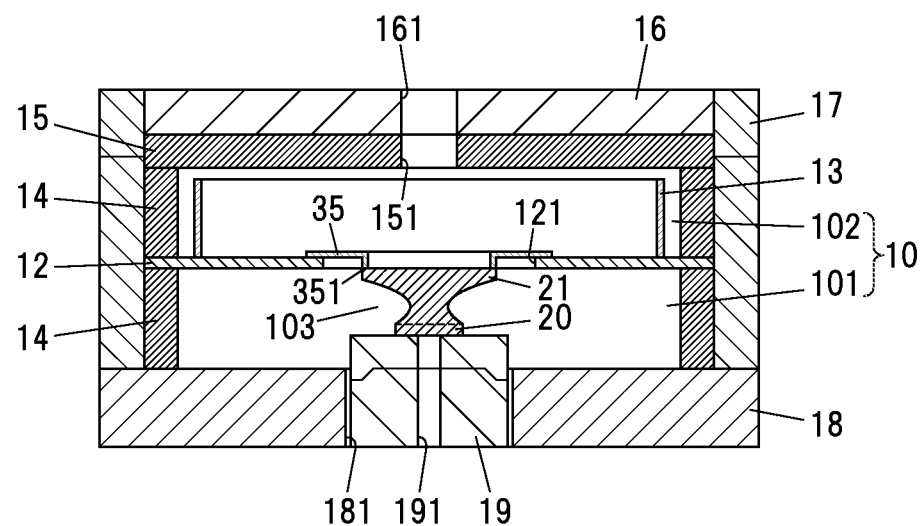
FIG. 7A is a vertical cross-sectional view showing a structure in which a shape control member to control the shape of the single crystal is placed.

FIG. 7A is a vertical cross-sectional view showing a structure in which a shape control member 35 to control the shape of the single crystal 21 is placed. The shape control member 35 is an annular member that is placed inside the hole 121 of the thermal insulation plate 12 and comes into contact with a melt on the outer peripheral portion of the upper surface of the single crystal 21, and the crystal grows mainly in a region inside an outer edge of an annular bottom surface 351 in contact with the melt. Thus, the cross-sectional shape of the single crystal 21 can be controlled by a planar shape of the outer edge of the bottom surface 351 of the annular shape control member 35.

The shape control member 35 is in contact with the single crystal 21 and the melt and is thus formed of a material that does not react therewith. When the single crystal 21 is, e.g., a gallium oxide-based single crystal, iridium or sapphire is used as the material of the shape control member 35. Nevertheless, since the shape control member 35 is in contact with the melt, the melt may be contaminated with impurities from the shape control member 35 depending on the composition of the single crystal 21 (the melt) or the material of the shape control member 35. However, since the melt flows from a non-contact region with the shape control member 35 toward a contact region, contamination with impurities is limited to near the contact region. Therefore, even when using the shape control member 35, it is possible to obtain the high-purity single crystal 21. For example, at the time of processing the single crystal 21 into wafers, it possible to remove the contaminated portion by scraping off an outer peripheral portion which was in contact with the shape control member 35.

Figure 7B:
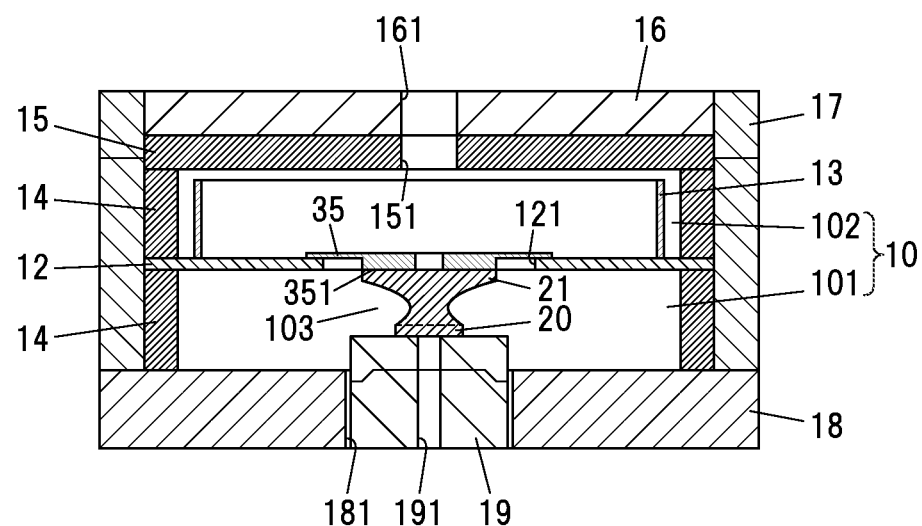
FIG. 7B is a vertical cross-sectional view showing a structure in which the shape control member having an annular bottom surface with an increased width is placed.

FIG. 7B is a vertical cross-sectional view showing a structure in which the shape control member 35 having the annular bottom surface 351 with an increased width is placed. By increasing the width of the annular bottom surface 351 until a portion of the bottom surface 351 on the inner edge side contacts with the upper surface of the seed crystal 20, the shape control member 35 can be not only used to control the shape of the single crystal 21 but also used as a member to facilitate the shouldering (diameter increase). Since the melt on the upper surface of the single crystal 21 (the seed crystal 20) spreads toward the outer edge of the annular bottom surface 351 at an interface between the single crystal 21 (the seed crystal 20) and the bottom surface 351, the diameter of the single crystal 21 can be increased from the diameter of the seed crystal 20 to about the diameter of the outer edge of the bottom surface 351 while growing the single crystal 21.

In case of the shape control member 35 having the bottom surface 351 with a large width as shown in FIG. 7B, the single crystal 21 is relatively susceptible to contamination with impurities from the shape control member 35 since the contact region between the bottom surface 351 and the melt is large. Therefore, firstly, the single crystal 21 with a large diameter is grown by performing the shouldering using the shape control member 35 having the bottom surface 351 with a large width. Then, using the seed crystal 20 with a large diameter cut out of this single crystal 21, a single crystal 21 is newly grown without using the shape control member 35 having the bottom surface 351 with a large width. It is thereby possible to obtain the single crystal 21 with a large diameter and a high purity.

(Method of Feeding the Melt of the Raw Material)

Next, a method of feeding the melt of the raw material onto the upper surface of the seed crystal 20 or the single crystal 21 will be described.

Figure 8A:
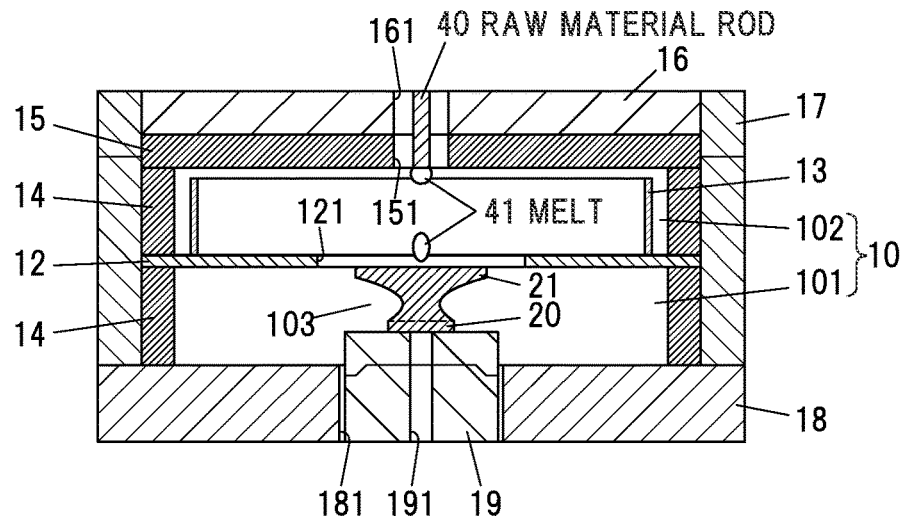
FIG. 8A is a schematic vertical cross-sectional view showing the state when a melt of a raw material is fed using a raw material rod.

FIG. 8A is a schematic vertical cross-sectional view showing the state when the melt of the raw material is fed using a raw material rod 40. The raw material rod 40 is a rod-shaped sintered body of a substance constituting the single crystal 21. When, e.g., a gallium oxide-based semiconductor single crystal is manufactured as the single crystal 21, a sintered body of a gallium oxide-based semiconductor is used as the raw material rod 40.

The raw material rod 40 is inserted into the through-holes 151, 161 serving as a raw material feeding port, a lower end thereof is positioned inside or in the vicinity of the second space 102 and is melted by heat in the second space 102 so that a melt 41 becomes a large molten ball and drops. At this time, it can be waited until the melt 41 drops under its own weight, or the raw material rod 40 may be vibrated to encourage the melt 41 to drop. The dropped melt 41 passes through the second space 102 and the hole 121 of the thermal insulation plate 12 and is fed onto the upper surface of the seed crystal 20 or the single crystal 21.

If droplets of the melt 41 are too large, the droplets scatter when reaching the upper surface of the single crystal 21 or destabilize the shape of the solid-liquid interface. Thus, it is preferable to adjust the size of the droplets by a diameter of the raw material rod 40. A relation between the diameter of the raw material rod 40 and the size of the droplets of the melt 41 is different depending on a specific gravity of the melt 41, but when the raw material rod 40 is, e.g., a sintered body of a gallium oxide-based semiconductor, the diameter thereof is preferably not more than 5 mm.

Figure 8B:
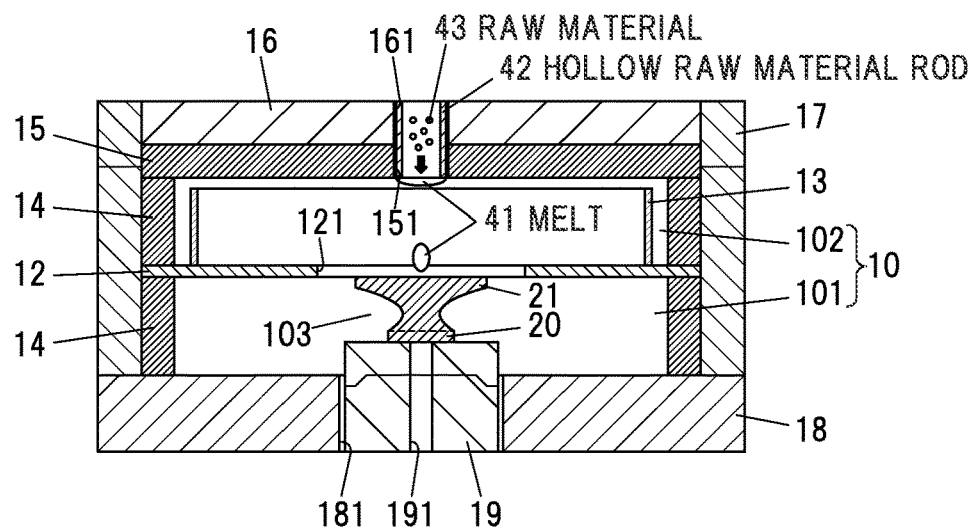
FIG. 8B is a schematic vertical cross-sectional view showing the state when the melt of the raw material is fed using a hollow raw material rod.

FIG. 8B is a schematic vertical cross-sectional view showing the state when the melt of the raw material is fed using a hollow raw material rod 42. The hollow raw material rod 42 is a hollow rod formed of a sintered body of the substance constituting the single crystal 21.

The hollow raw material rod 42 is inserted into the through-holes 151, 161 serving as a raw material feeding port, a tip thereof is positioned inside or in the vicinity of the second space 102 and is melted by heat in the second space 102 to form a ball of the melt 41. A powder or granule raw material 43 is further poured down into the hollow raw material rod 42 and is melted at a lower end of the hollow raw material rod 42 by heat in the second space so that the melt becomes a large molten ball. The raw material 43 is a sintered body of the substance constituting the single crystal 21, in the same manner as the hollow raw material rod 42.

It can be waited until the melt 41 drops under its own weight, or the hollow raw material rod 42 may be vibrated to encourage the melt to drop, or a gas may be sent through the inside of the hollow raw material rod 42 to encourage the melt to drop. The dropped melt 41 passes through the second space 102 and the hole 121 of the thermal insulation plate 12 and is fed onto the upper surface of the seed crystal 20 or the single crystal 21.

Alternatively, a hollow pipe, which is not formed of the raw material of the single crystal 21 and is formed of a material not reacting with the raw material 43 or the melt 41, may be used in place of the hollow raw material rod 42. Also in this case, the raw material 43 poured down into the hollow pipe can be melted at a lower end of the hollow pipe to form a ball of the melt when an inner diameter of the hollow pipe is sufficiently small.

Figure 8C:
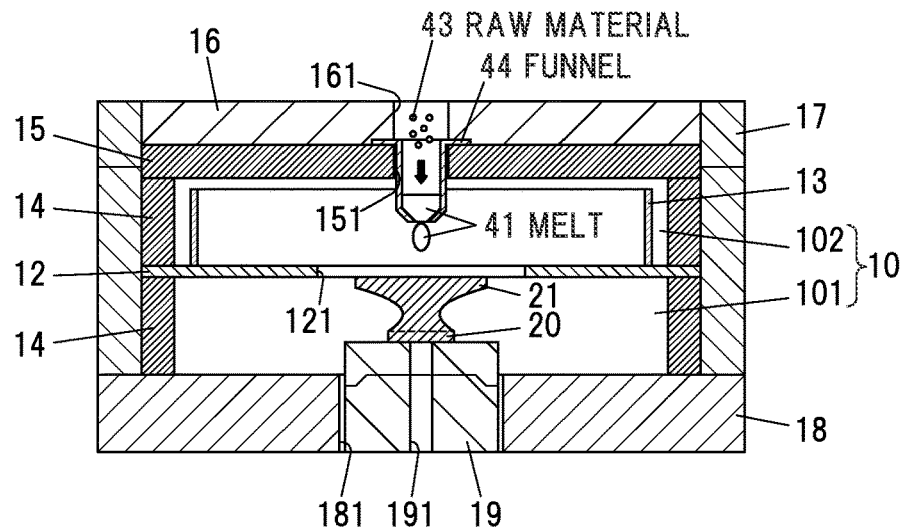
FIG. 8C is a schematic vertical cross-sectional view showing the state when the melt of the raw material is fed using a funnel.

FIG. 8C is a schematic vertical cross-sectional view showing the state when the melt of the raw material is fed using a funnel 44. The funnel 44 is formed of a material not reacting with the raw material 43 or the melt 41. When manufacturing, e.g., the single crystal 21 formed of a gallium oxide-based semiconductor, iridium or sapphire is used as the material of the funnel 44.

The funnel 44 is placed so that its lower end is located inside the second space 102. When the raw material 43 is poured down into the funnel 44 through the through-holes 151, 161 serving as a raw material feeding port, the raw material 43 is melted in the funnel 44 by heat in the second space 102 and turns into the melt 41. The melt 41 dropped from the funnel 44 passes through the second space 102 and the hole 121 of the thermal insulation plate 12 and is fed onto the upper surface of the seed crystal 20 or the single crystal 21.

Alternatively, the raw material 43 may be poured down into the through-holes 151, 161 without using the hollow raw material rod 42 or the funnel 44 described above. In this case, ideally, the raw material 43 is melted by heat in the second space 102 during falling and is fed as the melt 41 onto the upper surface of the single crystal 21. However, even in case that the raw material 43 reaches the upper surface of the single crystal 21 in a non-melted powder or granule form and is melted on the upper surface of the single crystal 21, there is no problem as long as a growth rate of the single crystal 21 is slow.

Figure 9:
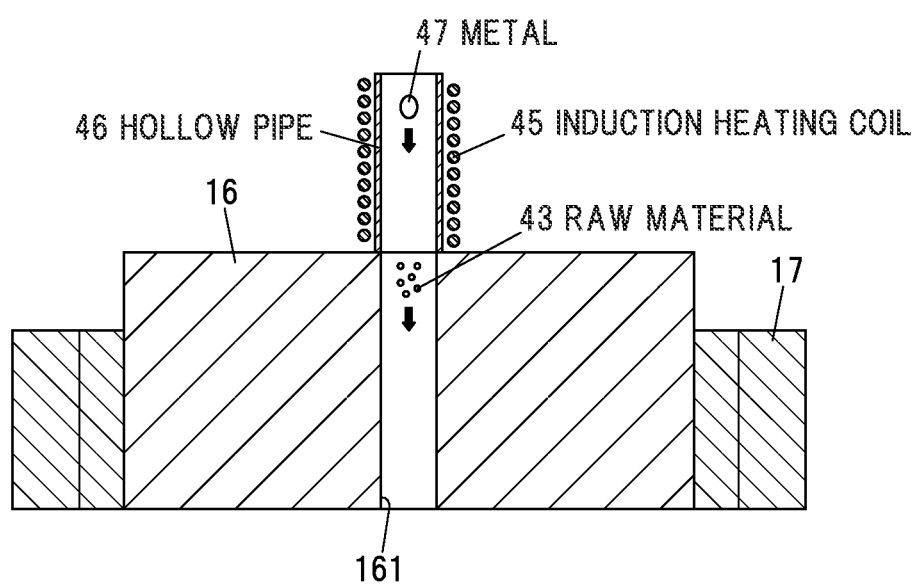
FIG. 9 is a schematic vertical cross-sectional view showing the state when the raw material, which is an oxide, is obtained by reacting a powder, granule or liquid metal with an oxygen gas.

FIG. 9 is a schematic vertical cross-sectional view showing the state when the raw material 43, which is an oxide, is obtained by reacting a metal 47 with an oxygen gas. The metal 47 is a metal to be a raw material of a metal component of the single crystal 21. When, e.g., a gallium oxide single crystal is manufactured as the single crystal 21, Ga metal is used as the metal 47 to obtain the raw material 43 that is a sintered body of a gallium oxide.

The metal 47 is poured down into a hollow pipe 46 that is placed on the thermal insulation material 16 so as to be connected to the through-hole 161. At the same time as pouring down the metal 47, an oxygen gas is introduced into the hollow pipe 46. An induction heating coil 45 to inductively heat the metal 47 is wound around the hollow pipe 46. The heated metal 47 reacts with the oxygen gas during falling down inside the hollow pipe 46, and the raw material 43 which is an oxide is thereby obtained.

In this method in which the raw material 43 is formed by reacting the metal 47 with the oxygen gas, it is possible to obtain the powder or granule raw material 43 with very high purity. When forming the raw material 43 which is, e.g., a sintered body of a gallium oxide, the raw material 43 with a purity of about 7N is obtained. By using this method, it is possible to form, e.g., the raw material 43 shown in FIG. 8B or FIG. 8C.

When Ga metal is used as the metal 47 and as long as it is in a small amount, a frequency of induction heating (a frequency of an AC current passing through the induction heating coil 45) is preferably not less than 100 kHz. The small amount here means that, e.g., the total volume of the Ga metal poured at a time is not more than 550 $mm^3$.

In addition, it is preferable to heat to a temperature of not less than 1,400° C. to oxidize the entire Ga metal since only the surface of the Ga metal is oxidized at about 1,000° C. When the heating temperature is not less than 1,400° C., the form of the Ga metal may be any of powder, granule, liquid, etc. When atomized Ga metal formed of nano particles is used as the metal 47, it is possible to entirely oxidize the Ga metal even when the heating temperature is less than 1,400° C. The nano particles of the Ga metal here can be formed by, e.g., irradiating the Ga metal with sound waves. In addition, since direct induction heating of nano particles of the Ga metal is difficult, a means to indirectly heat the nano particles of the Ga metal is required, such as placing a body to be heated by induction heating inside the hollow pipe 46 and using its radiation heat.

In addition, based on the method of obtaining the high-purity power or granule raw material 43 described above, it is possible to provide a gallium oxide manufacturing method defined in [1] to [3] below.

[1] A gallium oxide manufacturing method including: introducing an oxygen gas and pouring down a Ga metal into a hollow pipe around which an induction heating coil is wound; and inductively heating the Ga metal inside the hollow pipe by a magnetic field generated by passing an AC current through the induction heating coil and obtaining a gallium oxide by reaction of the Ga metal with oxygen gas.

[2] The method defined in [1] above, wherein the Ga metal is heated to a temperature of not less than 1,400° C. by the induction heating.

[3] The method defined in [1] or [2] above, wherein a frequency of the induction heating is not less than 100 kHz.

Effects of the Embodiment

Since a crucible is not used in the single crystal manufacturing apparatus 1 in the embodiment, an amount of ingot used is small and the facility cost can be significantly reduced. In addition, since the crucible is not used, there is no possibility of a decrease in purity of the single crystal 21 due to incorporation of components included in the crucible. Furthermore, since heat dissipation from the growth surface of the single crystal 21 is suppressed, it is possible to manufacture the large-size single crystal 21.

When, e.g., the single crystal 21 formed of a gallium oxide is manufactured using a raw material with a purity of 6N by the single crystal manufacturing apparatus 1 (except the form using the shape control member 35 having the bottom surface 351 with a large width shown in FIG. 7B and the form using the funnel 44 shown in FIG. 8C), a wafer with a carrier concentration of less than $1 \times 10^{16}$ $cm^{-3}$ without compensation of holes can be cut out of the single crystal 21. Meanwhile, when the single crystal 21 formed of a gallium oxide is manufactured using a raw material with a purity of 7N by the single crystal manufacturing apparatus 1, a wafer with a carrier concentration of less than $1 \times 10^{15}$ $cm^{-3}$ without compensation of holes can be cut out of the single crystal 21. Then, by using such wafers, it is possible to make high-withstand voltage devices without providing an epitaxial layer to ensure withstand voltage. In this regard, the form using the shape control member 35 having the bottom surface 351 with a large width shown in FIG. 7B and the form using the funnel 44 shown in FIG. 8C are excluded because the single crystal 21 may be contaminated with impurities from the shape control member 35 or the funnel 44.

Although the embodiment of the invention has been described, the invention is not limited to the embodiment, and the various kinds of modifications can be implemented without departing from the gist of the invention. In addition, the constituent elements in the embodiment can be arbitrarily combined without departing from the gist of the invention.

In addition, the embodiment described above does not limit the invention according to claims. Further, please note that all combinations of the features described in the embodiment are not necessary to solve the problem of the invention.

REFERENCE SIGNS LIST

1 SINGLE CRYSTAL MANUFACTURING APPARATUS
10 INSULATED SPACE
101 FIRST SPACE
102 SECOND SPACE
103 CRYSTAL GROWTH REGION
11 INDUCTION HEATING COIL
12 THERMAL INSULATION PLATE
121 HOLE
13 HEATING ELEMENT
19 SUPPORT SHAFT
20 SEED CRYSTAL
21 SINGLE CRYSTAL
31, 32 THERMAL INSULATION MATERIAL
33 HEATING ELEMENT
34 THERMAL INSULATION PLATE
35 SHAPE CONTROL MEMBER
40 RAW MATERIAL ROD
41 MELT
42 HOLLOW RAW MATERIAL ROD
43 RAW MATERIAL
44 FUNNEL

What is claimed is:

1. A single crystal manufacturing apparatus for growing a single crystal upward from a seed crystal, the single crystal manufacturing apparatus comprising:
an insulated space thermally insulated from an external space of the single crystal manufacturing apparatus;
a thermal insulation plate that divides the insulated space into a first space including a crystal growth region below the thermal insulation plate and a second space above the thermal insulation plate;
a heating element that is placed in the second space; and
a support shaft that is vertically movable in the crystal growth region in the first space and supports a seed crystal placed in the first space from below,
wherein the thermal insulation plate has a hole that penetrates the thermal insulation plate directly above the support shaft for communicating the first space with the second space, and
wherein the hole has a diameter larger than those of the crystal growth region and the seed crystal in the first space.

2. The single crystal manufacturing apparatus according to claim 1, further comprising an annular member that is placed inside the hole of the thermal insulation plate and has an annular bottom surface that can control a cross-sectional shape of the single crystal by a planer shape of an outer edge thereof.

3. The single crystal manufacturing apparatus according to claim 2, wherein the annular bottom surface has a width that allows a portion of the annular bottom surface on the inner edge side to contact with the upper surface of the seed crystal placed on the support shaft.

4. The single crystal manufacturing apparatus according to claim 1, wherein the insulated space is surrounded by a first thermal insulation material as a side wall for the first and second space, a second thermal insulation material as an upper wall for the second space, and a base supporting the first and second thermal insulation materials from the bottom of the first space, wherein the second thermal insulation material has a through-hole penetrating therethrough for feeding a raw material of the single crystal into the second space, and wherein the base has a shaft hole in which the support shaft that can be vertically moved.

5. The single crystal manufacturing apparatus according to claim 4, wherein a third thermal insulation material is placed on the second thermal insulation material as the upper wall, and wherein a third thermal insulation material has a through-hole vertically penetrating the third thermal insulation material so as to connect the through-hole vertically penetrating the second thermal insulation material, and wherein the through-hole has a diameter smaller than the crystal growth region.

6. The single crystal manufacturing apparatus according to claim 4, wherein an annular fourth thermal insulation material is placed in the first space so as to surround the crystal growth region in the first space.

7. A method for growing a single crystal upward from a seed crystal, comprising the steps of:
placing a seed crystal in a first space directly below a hole in a thermal insulation plate that divides a thermal insulation space into the first space and a second space above the first space and has the hole that penetrates the first space and the second space;
melting an upper surface of the seed crystal by radiation heat of a heating element placed in the second space;
feeding a melt of a raw material of the single crystal from the second space and through the hole of the thermal insulation plate onto the molten upper surface of the seed crystal;
moving the seed crystal downward by pulling down a support shaft which supports the seed crystal from below while continuously feeding the melt of the raw material; and
growing the single crystal on the upper surface of the seed crystal by gradually crystallizing the melt from the upper surface of the seed crystal to the upward direction,
wherein the single crystal is grown upward from the upper surface of seed crystal so as to have a diameter smaller than that of the hole inside a contour of the hole without contacting the thermal insulation plate and larger than that of the seed crystal.

8. The method for growing a single crystal upward from a seed crystal according claim 7, wherein an annular member is placed inside the hole of the thermal insulation plate so that a portion of an annular bottom surface on the inner edge side contacts with the molten upper surface of the seed crystal, wherein the melt of a raw material of the single crystal is fed through an opening of the annular member onto the molten upper surface of the seed crystal and at an interface between the molten upper surface of the seed crystal and the annular bottom surface of the annular member, and wherein the single crystal is grown between the annular bottom surface of the annular member and the upper surface of the seed crystal.

9. The method for growing a single crystal upward from a seed crystal according to claim 8, wherein, while moving the seed crystal downward, spreading the melt on the upper surface of the seed crystal or on an upper surface of the single crystal toward an outer edge of the annular bottom surface of the annular member at the interface between the upper surface of seed crystal or the upper surface single crystal grown on the seed crystal and the annular bottom surface of the annular member, thereby growing the single crystal with shoulders spreading in the upward direction from the seed crystal.

10. The method for growing a single crystal upward from a seed crystal according to claim 8, wherein the single crystal is grown in a region inside an outer edge of the annular bottom surface, and a cross-sectional shape of the grown single crystal is controlled by a planer shape of the outer edge of the annular bottom surface of the annular member.

11. A method for growing a single crystal upward from a seed crystal, comprising the steps of:
    feeding a melt of a raw material of the single crystal onto an upper surface of a single crystal grown on a seed crystal;
    placing an annular member on the melt fed on the single crystal so that an annular bottom surface of the annular member contacts with the melt of an outer peripheral portion of the upper surface of the single crystal; and
    growing the single crystal in a region inside an outer edge of the annular bottom surface to have a cross-sectional shape controlled by a planer shape of the outer edge of the annular bottom surface by moving the seed crystal downward while feeding the melt of the raw material, wherein the single crystal is grown upward from the upper surface of the seed crystal so as to have a diameter equal to or smaller than that of the outer edge of the annular bottom surface and larger than that of the seed crystal.

12. The single crystal manufacturing method according to claim 7, wherein all of the steps are performed in a thermally insulated space insulated from the outside.

13. The single crystal manufacturing method according to claim 11, wherein all of the steps are performed in a thermally insulated space insulated from the outside.

14. The single crystal manufacturing method according to claim 7, wherein the single crystal grown on the seed crystal is an oxide.

15. The single crystal manufacturing method according to claim 11, wherein the single crystal is an oxide.

16. The single crystal manufacturing method according to claim 7, wherein droplets of the melt of the raw material of the single crystal are fed onto the molten upper surface of the seed crystal and an upper surface of the single crystal grown on the seed crystal.

17. The single crystal manufacturing method according to claim 11, wherein droplets of the melt of the raw material of the single crystal are fed onto the upper surface of the single crystal.

* * * * *